United States Patent
Shih et al.

(10) Patent No.: US 8,420,541 B2
(45) Date of Patent: Apr. 16, 2013

(54) METHOD FOR INCREASING ADHESION BETWEEN POLYSILAZANE AND SILICON NITRIDE

(75) Inventors: Shing-Yih Shih, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 102 days.

(21) Appl. No.: 13/102,506

(22) Filed: May 6, 2011

(65) Prior Publication Data

US 2012/0282777 A1    Nov. 8, 2012

(51) Int. Cl.
*H01L 21/311*    (2006.01)
*H01L 21/31*    (2006.01)

(52) U.S. Cl.
USPC ............. 438/702; 438/771; 257/E21.24

(58) Field of Classification Search .......... 438/702, 438/771
See application file for complete search history.

(56) References Cited

U.S. PATENT DOCUMENTS

| | | | | |
|---|---|---|---|---|
| 6,677,251 | B1 * | 1/2004 | Lu et al. | 438/778 |
| 6,774,048 | B2 * | 8/2004 | Baek et al. | 438/758 |
| 7,163,869 | B2 * | 1/2007 | Kim et al. | 438/424 |
| 2003/0224617 | A1 * | 12/2003 | Baek et al. | 438/763 |
| 2004/0018748 | A1 * | 1/2004 | Lu et al. | 438/778 |
| 2006/0102977 | A1 * | 5/2006 | Fucsko et al. | 257/499 |

* cited by examiner

*Primary Examiner* — Lex Malsawma

(57) ABSTRACT

A method for increasing adhesion between polysilazane and silicon nitride is disclosed, comprising, providing a substrate comprising a trench, forming a silicon nitride liner layer on a bottom surface and a sidewall of the trench, performing a treating process to the silicon nitride liner layer for producing a hydrophilic surface with OH groups that can increase adhesion between the silicon nitride liner layer and a subsequently formed polysilazane coating layer, and forming a polysilazane coating layer into the trench and on the silicon nitride liner layer.

20 Claims, 7 Drawing Sheets

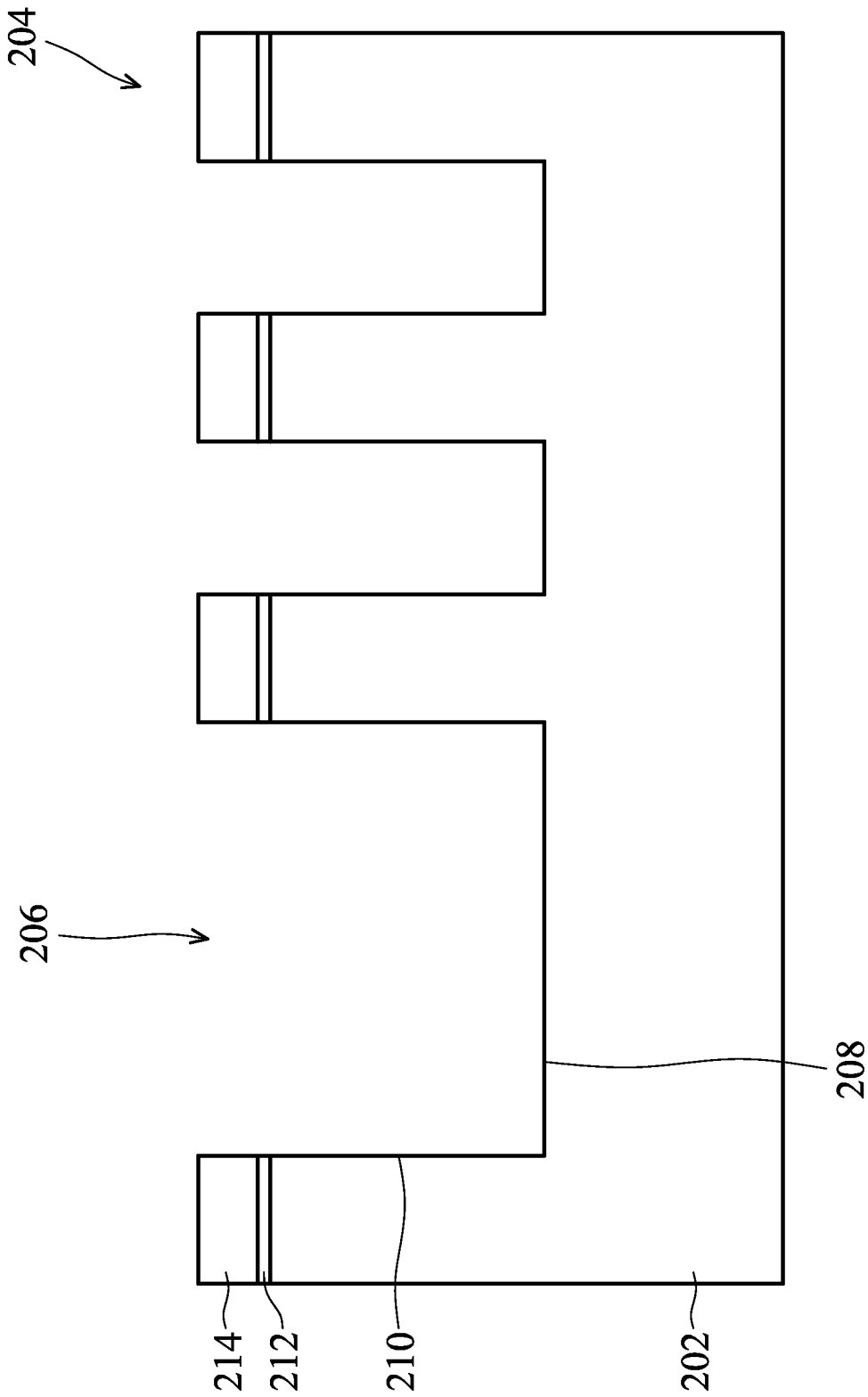

METHOD FOR INCREASING ADHESION BETWEEN POLYSILAZANE AND SILICON NITRIDE

BACKGROUND OF THE INVENTION

1. Field of the Invention

The invention relates generally to semiconductor processing methods of forming and utilizing insulative materials for electrical isolation in integrated circuits, and more particularly to processes for increasing adhesion between polysilazane and silicon nitride.

2. Description of the Related Art

For the fabrication of semiconductor integrated circuits, semiconductor devices are integrated and laid out in a small area of a chip, thus requiring the devices to be placed in close proximity to each other. With the continued decrease in the dimensions and spacing of devices on integrated circuits (ICs), insulative materials are being deposited on ICs, to electrically isolate various active components, such as transistors, resistors and capacitors. Isolation insulative materials are typically made of silicon dioxide ($SiO_2$).

For example, interlayer dielectric (ILD) or pre-metal dielectric (PMD) layers isolate structures from metal interconnect layers, which may require the filling in of narrow gaps having high aspect ratios (ratio of depth to width) of five or greater. Insulative structures, such as shallow trench isolation (STI) regions are formed in recesses (trenches) in the substrate between components. Such trenches can have a width as narrow as 0.01 to 0.05 microns or smaller, and the filling in of such narrow features can be difficult. In addition, the dielectric material must be able to withstand subsequent processing steps, such as etching and cleaning steps.

Dielectric materials are typically deposited by chemical vapor deposition (CVD) or plasma enhanced chemical vapor deposition (PECVD). For example, in a typical STI method, a trench is etched into a silicon substrate, and the trench is filled by CVD of an oxide, such as silicon dioxide as a conformal layer. In the trenches, the conformal layers of oxide are initially formed on the sidewalls and grow in size outward into the center of the trench to where the oxide layers meet. With high aspect ratio features, the width of the trench have become narrower and the depth becomes much greater, such that it is difficult to form a void-free or seam-free gap fill using the standard CVD or PECVD techniques.

Flowable materials, such as spin-on dielectrics (SODs), spin-on glasses (SOGs), and spin-on polymers, such as silicates, siloxanes, silazanes or silisesquioxanes, have been developed that generally have good gap filling properties. A silicon oxide film is formed by spin-coating a liquid solution of the silicon-containing polymer onto a surface of a substrate, and then baking the material to remove the solvent, and then the polymer layer in an oxygen is thermally oxidized, or steamed, with an atmosphere of an elevated temperature of up to about 1000° C. An issue concerning current methods for forming a trench isolation is illustrated in accordance with FIG. 1. Referring to FIG. 1, a trench 104 is formed using a pad layer 108 on a substrate 102 as a mask. A polysilzane coating layer is coated onto the substrate 102 and into the trench 104, and then cured with containing oxygen ($O_2$) ambient at high temperature to form a silicon oxide layer 110 in the trench 104. In the current methods, in order to avoid consumption of the substrate 102 due to reaction with $O_2$ and/or $H_2O$ during the oxidization process of the polysilazane coating layer, a silicon nitride liner layer 106 is required. However, divots 112 are formed during subsequent deglassing, or wet etch back processes post CMP because the polysilazane coating layer has bad adhesion with the underlying silicon nitride liner layer 106. Consequently, a method for increasing adhesion between polysilazane and silicon nitride is required.

BRIEF SUMMARY OF INVENTION

The invention provides a method for increasing adhesion between polysilazane and silicon nitride, comprising, providing a substrate comprising a trench, forming a silicon nitride liner layer on a bottom surface and a sidewall of the trench, performing a treating process to the silicon nitride liner layer for producing a hydrophilic surface with OH groups that can increase adhesion between the silicon nitride liner layer and a subsequently formed polysilazane coating layer, and forming a polysilazane coating layer into the trench and on the silicon nitride liner layer.

The invention provides a method for forming a trench isolation, comprising, providing a substrate, forming a trench in the substrate, forming a silicon nitride liner layer on a bottom surface and a sidewall of the trench, performing a treating process to the silicon nitride liner layer for producing a hydrophilic surface with OH groups that can increase adhesion between the silicon nitride liner layer and a subsequently formed polysilazane coating layer, forming a polysilazane coating layer into the trench and on the silicon nitride liner layer, heating the substrate to oxidize the polysilazane coating layer to form a silicon oxide layer, and planarizing the silicon oxide layer.

BRIEF DESCRIPTION OF DRAWINGS

The invention can be more fully understood by reading the subsequent detailed description and examples with references made to the accompanying drawings, wherein.

FIGS. 2A-2F show intermediate cross sections of a method for forming a trench isolation structure of an embodiment of the invention.

DETAILED DESCRIPTION OF INVENTION

Figure 1:
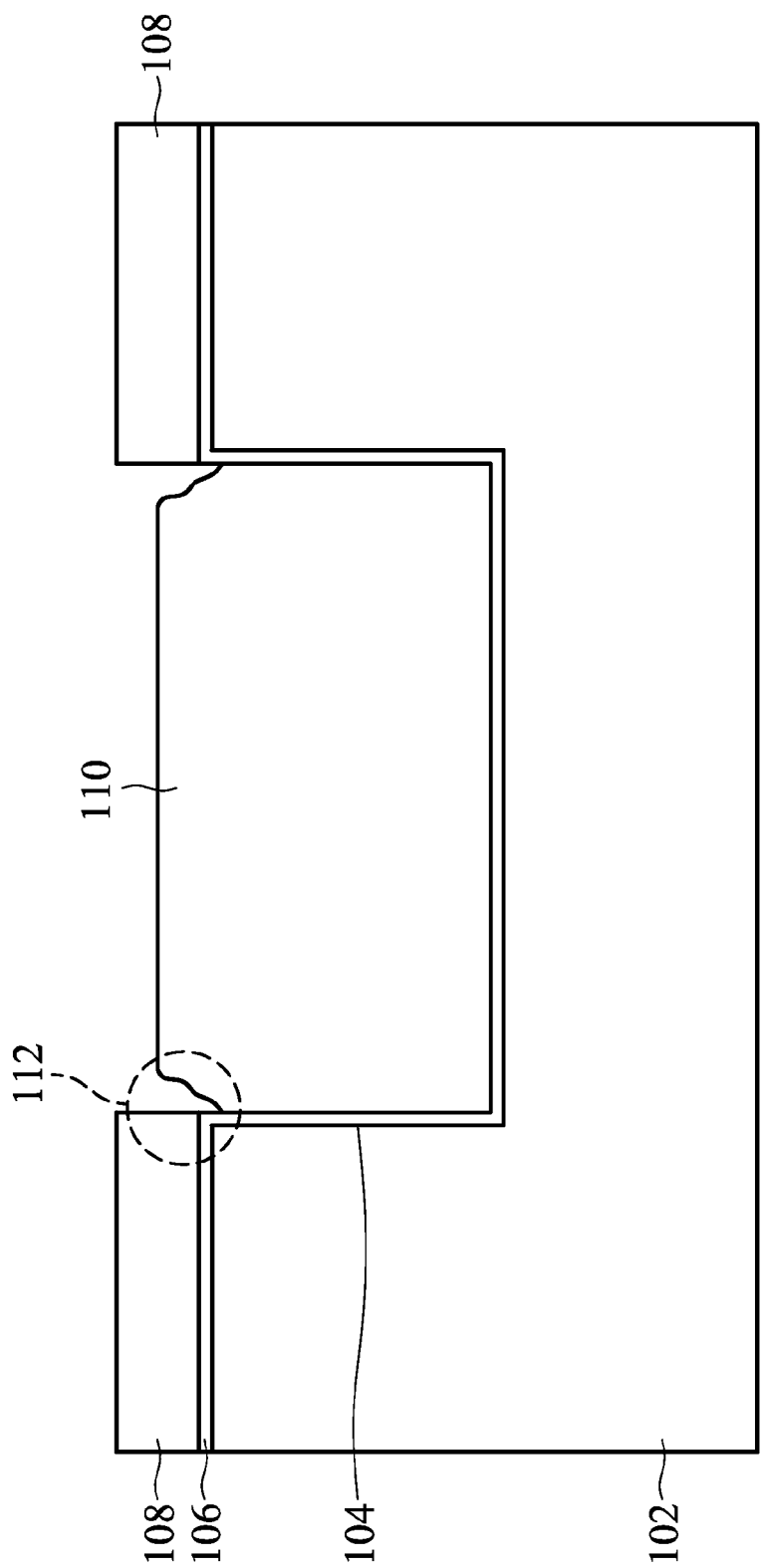
FIG. 1 shows an issue of current methods for forming a trench isolation.

It is understood that specific embodiments are provided as examples to teach broader inventive concepts, and one of ordinary skill in the art can easily apply the teaching of the present disclosure to other methods or apparatus. The following discussion is only used to illustrate the invention, and not limit the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 2A-2F illustrate a method for forming a trench isolation structure, which may be employed for electrically isolating devices in an integrated circuit from one another. By way of example, the STI structure can be formed relative to formation of transistor gates and adjacent transistor source/drain regions of a substrate.

Referring to FIG. 2A, a wafer fragment 204 is shown at a preliminary processing step. The wafer fragment 204 can comprise a semiconductor wafer substrate 202 or the wafer 204 along with various process layers formed thereon, including one or more semiconductor layers or other formations, and active or operable portions of semiconductor devices. A semiconductor device can comprise a transistor, capacitor, electrode, insulator or any variety of components commonly utilized by semiconductor structures.

The wafer fragment 204 is shown as comprising a semiconductor substrate 202 having a first pad layer 212 of about 8-20 nm formed thereon, which serves as a pad oxide ($SiO_2$) layer. A first pad layer 212 can be formed, for example, by thermal oxidation of the substrate 202, and by CVD deposition, sputtering, and the like. Further, a thicker second pad layer 214, preferably a silicon nitride ($Si_3N_4$) layer having a thickness of about 40-200 nm, can be formed over the first pad layer 212 by CVD or other deposition techniques, to provide oxidation and a CMP hard mask layer. A photoresist mask layer (not shown) is applied and patterned using a lithographic patterning technique, and the first pad layer 212, second pad layer 214, and substrate 202 are etched to form an opening or recess, such as a shallow trench 206 in the substrate 202 for device isolation. For example, the trench 206 can have a width of about 0.1 µm and a depth of about 0.5 µm, with an aspect ratio of 5 (=0.5/0.1). The trench 206 includes sidewalls 210 and a bottom surface 208. The trench 206 can have sloped or tapered sidewalls or vertical sidewalls formed by an anisotropic etching process. The photoresist mask layer is then removed.

Figure 2B:
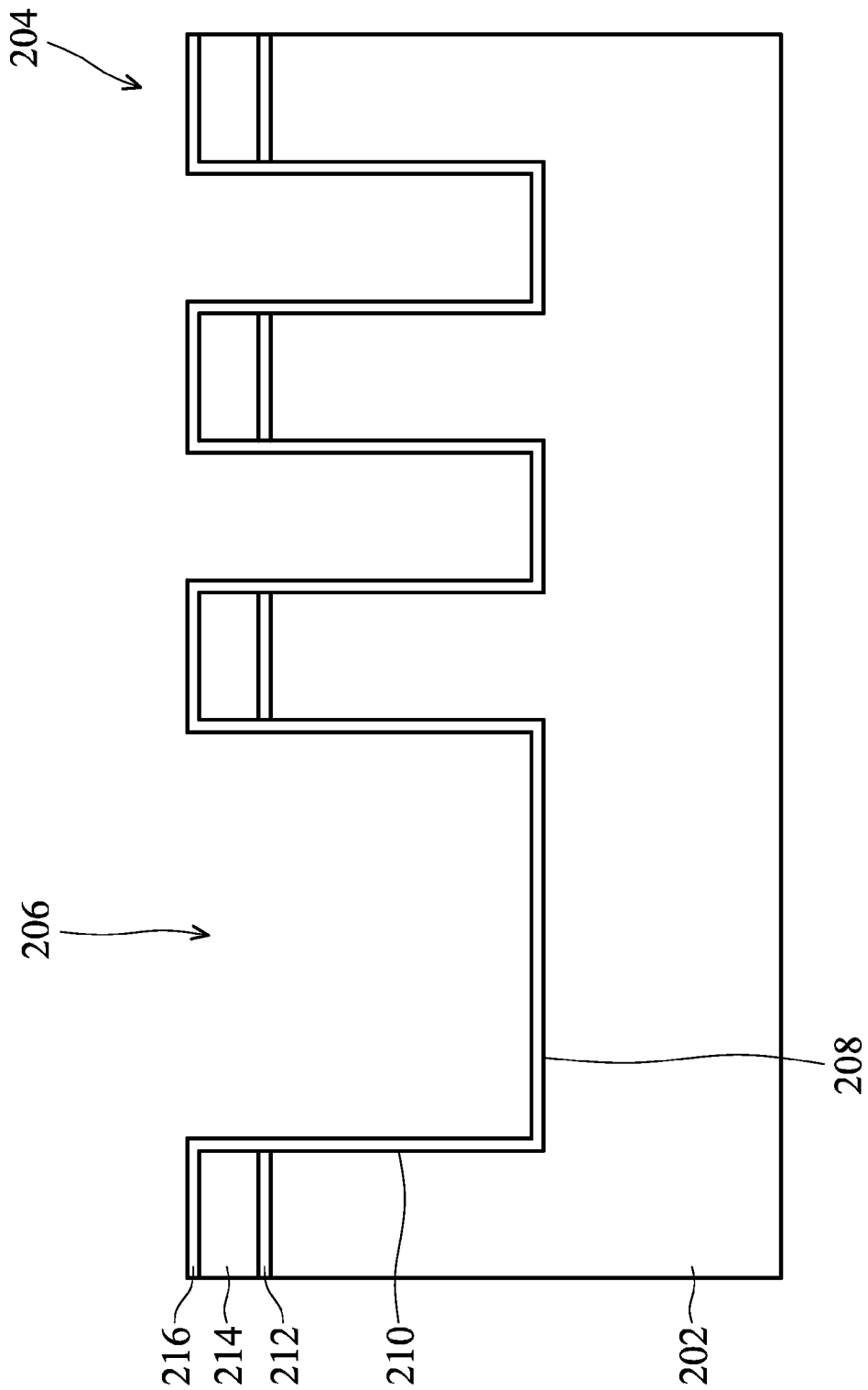

After stripping the photoresist mask layer and cleaning the trenched structure, as shown in FIG. 2B, a thin silicon nitride liner layer 216 can then be formed on the sidewalls 210 and bottom surface 208 of the trench 206, for example, by thermal nitridation (in furnace) or high density plasma CVD using $SiH_4$ and $NH_3$ as source gases. The silicon nitride liner layer 216 is about 5 nm to about 20 nm thick.

Figure 2C:
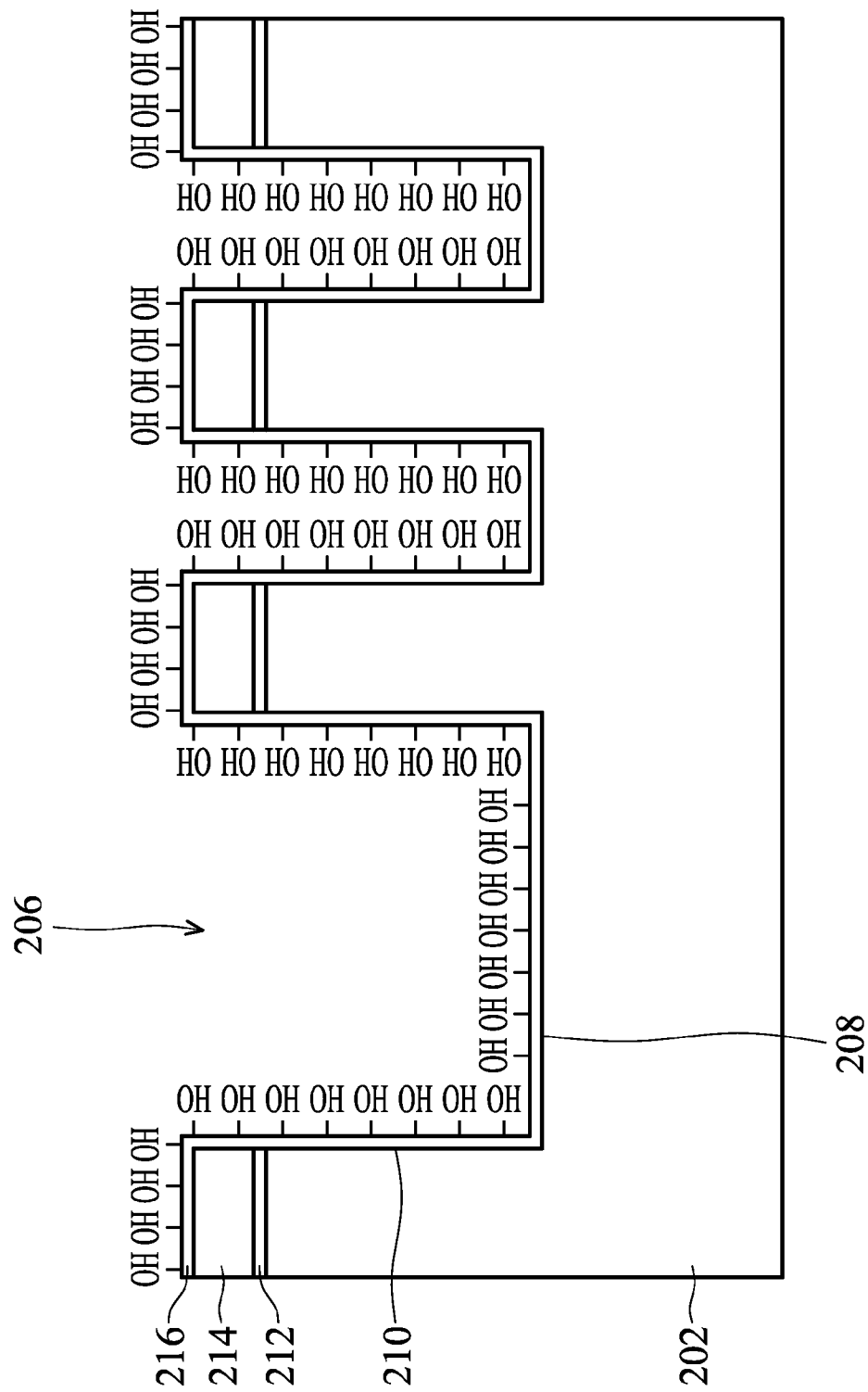

Referring to FIG. 2C, since adhesion between the silicon nitride liner layer 216 and a subsequently formed polysilazane coating layer is not satisfactory, a treating process is performed to the silicon nitride liner layer 216 to increase adhesion ability of the silicon nitride liner layer 216 with the subsequently formed polysilazane coating layer. In an embodiment of the invention, the treating process is performed on the silicon nitride liner layer 216 in order to produce a hydrophilic surface with OH groups that will improve adhesion between the silicon nitride liner layer 216 and a subsequently formed polysilazane coating layer because Si—OH can interact with $(SiH_2NH)_n$ to produce strong chemical bonding. In a preferred embodiment of the present invention, the applied treatment to the silicon nitride liner layer 216 is a wet treatment. For example, the wet treatment uses deionized (DI) water, acid solution or alkaline solution to treat the silicon nitride liner layer 216. For example, the substrate 202 with the silicon nitride liner layer 216 is immersed in the deionized (DI) water, acid solution or alkaline solution, wherein the acid solution comprise HCl or HPM ($HCl/H_2O_2/H_2O$), and the alkaline solution comprise KOH, tetramethylammonium hydroxide (TMAH) or APM ($NH_4OH/H_2O_2/H_2O$). In an example, the HPM has a ratio of $HCl/H_2O_2/H_2O=1/2/50$, the APM has a ratio of $NH_4OH/H_2O_2/H_2O=1/1/50$, the process temperature is about room temperature to 100° C., and the treating time is about 1-10 min. In another embodiment of the invention, the applied treatment to the silicon nitride liner layer 216 is a steam treatment, wherein process temperature thereof can be 100° C. to 200° C.

Figure 2D:
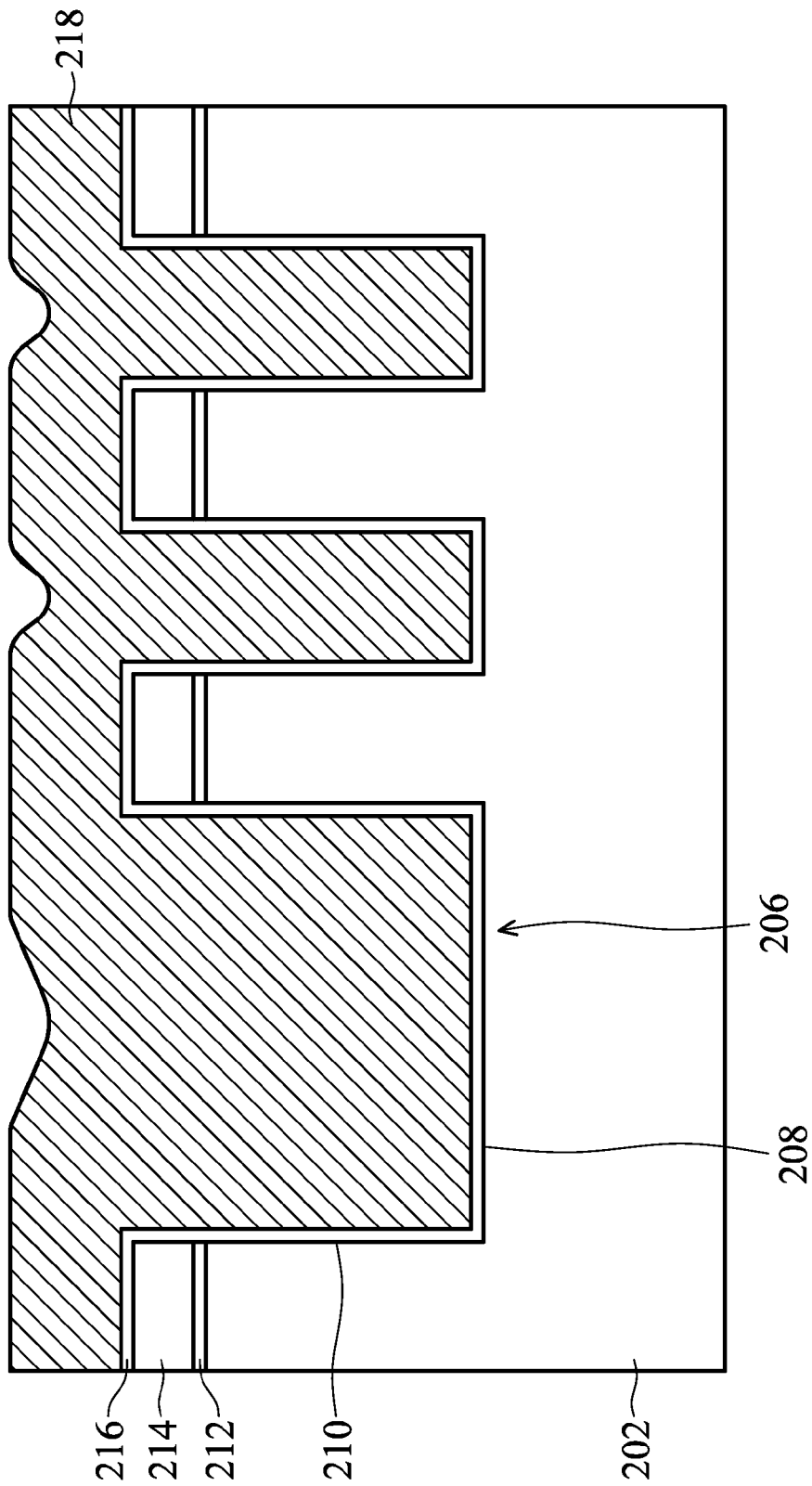

As shown in FIG. 2D, a spin-on polysilazane solution is coated on the substrate 202 and into the trench 206 to form a polysilazane coating layer 218. Typically, the polysilazane coating layer 218 is formed on the substrate 202 by a spin coating or a "spin-on-glass (SOG)" process, although other methods, such as flow coating, dipping or spraying can be used. In a preferred embodiment, the polysilazane coating layer 218 is deposited as a coating from a polysilazane solution in an organic solvent by spin coating (or SOG process) to fill a predetermined portion of or the entire portion of the trench 206. The polysilazane contains $Si_xN_yH_z$ type units, in which the Si atoms are in a "reducing environment" in the —Si—NH— bonds. The polysilazane material cannot be etched or processed reasonably without modification, and even 500:1 HF will etch it non-uniformly with a greater than 1000 ·/minute etching rate. Oxidation of the N bonds is required to transform the material to $SiO_2$.

In forming a layer on the substrate 202, a solution of polysilazane is dropped onto a surface of a silicon substrate or layer on the substrate 202 while rotating the substrate 202 on a horizontal plane to form a uniformly-coated film of the solution on the entire surface of the substrate 202 or layer due to the centripetal force applied to the substrate 202 (e.g. wafer). The thickness of the polysilazane coating layer 218 can be controlled by means of the concentration of the coating solution and the speed of rotation of the substrate 202. The coating layer generally ranges in thickness from about 30 nm to about 500 nm.

The conditions under which the polysilazane solution is spin-coated onto the surface of the substrate 202 include a substrate 202 temperature of about 18° C., to about 30° C., and a typical spin rotation of about 500 rpm to about 6,000 rpm for a rotation time of about 2 seconds.

Figure 2E:
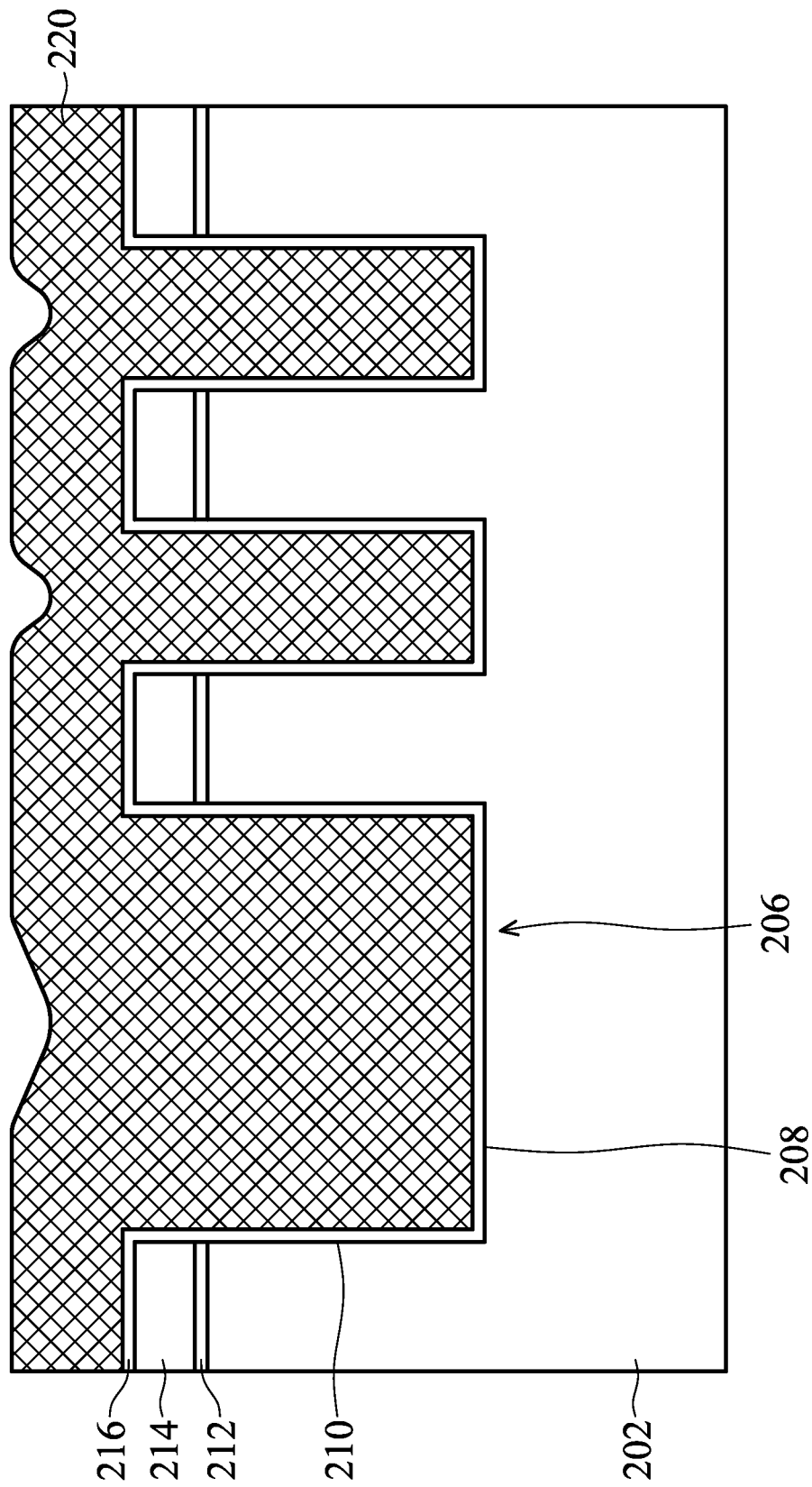

As depicted in FIG. 2E, after coating, the substrate 202 is heated to oxidize the polysilazane coating layer 218 by removing the organic solvent and produces a silicon oxidize layer 220. In this step, the polysilazane coating layer 218 is subjected to oxidize the polysilazane groups $Si_xN_yH_z$ of the polysilazane material by replacing nitrogen and hydrogen atoms with oxygen atoms to form the layer into an oxygen rich material, i.e., a silicon oxide, and primarily silicon dioxide ($SiO_2$) material.

Figure 2F:
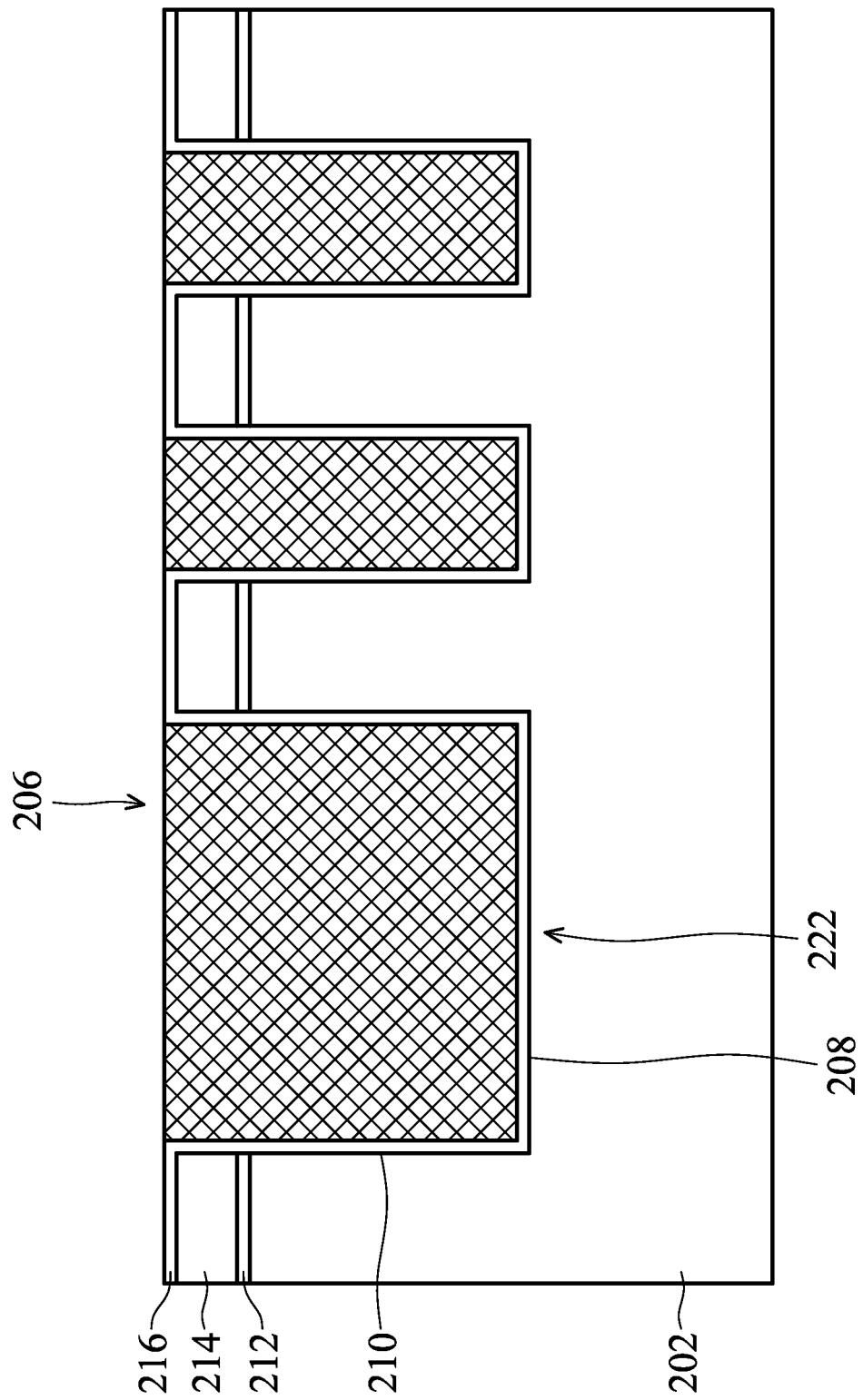

Referring to FIG. 2F, after formation, the silicon oxide layer 220 can be planarized by chemical mechanical polish (CMP), and etch back processes, and the like to complete the trench isolation structure 222 by removing a portion of the silicon oxide layer 220, and filling the trench 206 to be level with the substrate 202. A gate or other structure can then be fabricated according to known techniques. Thus, the exemplary shallow trench isolation structure 222 depicted in FIG. 2F, includes a substrate 202, a first pad layer 212, a second pad layer 214, a trench 206, a silicon nitride liner layer 216 and a silicon oxide layer 220.

The method for increasing adhesion between polysilazane and silicon nitride of an embodiment of the invention can treat the silicon nitride liner layer to have a strong chemical bond with the polysilazane coating layer, such that the issue of the forming of divots during subsequent deglassing, or wet etching back processes can be eliminated.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for increasing adhesion between polysilazane and silicon nitride, comprising:
    providing a substrate comprising a trench;
    forming a silicon nitride liner layer on a bottom surface and a sidewall of the trench;
    performing a treating process to the silicon nitride liner layer for producing a hydrophilic surface with OH groups that increases adhesion between the silicon nitride liner layer and a subsequently formed polysilazane coating layer; and
    forming the polysilazane coating layer into the trench and on the silicon nitride liner layer.

2. The method for increasing adhesion between polysilazane and silicon nitride as claimed in claim 1, wherein the step of performing the treating process to the silicon nitride liner layer comprises:
    using deionized (DI) water, acid solution or alkaline solution to treat the silicon nitride liner layer.

3. The method for increasing adhesion between polysilazane and silicon nitride as claimed in claim 2, wherein the acid solution comprises HCl or HPM ($HCl/H_2O_2/H_2O$).

4. The method for increasing adhesion between polysilazane and silicon nitride as claimed in claim 2, wherein the alkaline solution comprises KOH, tetramethylammonium hydroxide (TMAH) or APM ($NH4OH/H_2O_2/H_2O$).

5. The method for increasing adhesion between polysilazane and silicon nitride as claimed in claim 3, wherein the HPM has a ratio of $HCl/H_2O_2/H_2O=1/2/50$.

6. The method for increasing adhesion between polysilazane and silicon nitride as claimed in claim 4, wherein the APM has a ratio of $NH4OH/H_2O_2/H_2O=1/1/50$.

7. The method for increasing adhesion between polysilazane and silicon nitride as claimed in claim 2, wherein the process temperature of the treating process is substantially room temperature to 100° C.

8. The method for increasing adhesion between polysilazane and silicon nitride as claimed in claim 1, wherein the step of performing the treating process to the silicon nitride liner layer comprises:
    using steam to treat the silicon nitride liner layer.

9. The method for increasing adhesion between polysilazane and silicon nitride as claimed in claim 1, wherein the process temperature of the steam treating process is substantially 100° C. to 200° C.

10. The method for increasing adhesion between polysilazane and silicon nitride as claimed in claim 1, further comprising heating the substrate to oxidize the polysilazane coating layer to form a silicon oxide layer.

11. The method for increasing adhesion between polysilazane and silicon nitride as claimed in claim 8, further comprising planarizing the silicon oxide layer.

12. A method for forming a trench isolation, comprising:
    providing a substrate;
    forming a trench in the substrate;
    forming a silicon nitride liner layer on a bottom surface and a sidewall of the trench;
    performing a treating process to the silicon nitride liner layer for producing a hydrophilic surface with OH groups that increases adhesion between the silicon nitride liner layer and a subsequently formed polysilazane coating layer;
    forming the polysilazane coating layer into the trench and on the silicon nitride liner layer;
    heating the substrate to oxidize the polysilazane coating layer to form a silicon oxide layer; and
    planarizing the silicon oxide layer.

13. The method for forming a trench isolation as claimed in claim 12, wherein the step of performing the treating process to the silicon nitride liner layer comprises:
    using deionized (DI) water, acid solution or alkaline solution to treat the silicon nitride liner layer.

14. The method for forming a trench isolation as claimed in claim 13, wherein the acid solution comprises HCl or HPM ($HCl/H_2O_2/H_2O$).

15. The method for forming a trench isolation as claimed in claim 13, wherein the alkaline solution comprises KOH, tetramethylammonium hydroxide (TMAH) or APM ($NH4OH/H_2O_2/H_2O$).

16. The method for forming a trench isolation as claimed in claim 14, wherein the HPM has a ratio of $HCl/H_2O_2/H_2O=1/2/50$.

17. The method for forming a trench isolation as claimed in claim 15, wherein the APM has a ratio of $NH4OH/H_2O_2/H_2O=1/1/50$.

18. The method for forming a trench isolation as claimed in claim 12, wherein the process temperature of the treating process is substantially room temperature to 100° C.

19. The method for forming a trench isolation as claimed in claim 12, wherein the step of performing the treating process to the silicon nitride liner layer comprises:
    using steam to treat the silicon nitride liner layer.

20. The method for forming a trench isolation as claimed in claim 12, wherein the process temperature of the steam treating process is substantially 100° C. to 200° C.

* * * * *